United States Patent
Wu et al.

(10) Patent No.: US 9,821,348 B2
(45) Date of Patent: Nov. 21, 2017

(54) METHOD AND APPARATUS FOR WATER EDGE EXPOSURE AND BACKSIDE CLEANING

(71) Applicant: Taiwan Semiconductor Manufacturing Company, Ltd., Hsin-Chu (TW)

(72) Inventors: Ming-Chang Wu, Tainan (TW); Jia-Hung Hsu, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 523 days.

(21) Appl. No.: 14/060,393

(22) Filed: Oct. 22, 2013

(65) Prior Publication Data

US 2015/0107620 A1    Apr. 23, 2015

(51) Int. Cl.
| B08B 1/04 | (2006.01) |
| H01L 21/02 | (2006.01) |
| B08B 1/00 | (2006.01) |
| G03F 7/20 | (2006.01) |

(52) U.S. Cl.
CPC ............... B08B 1/04 (2013.01); B08B 1/00 (2013.01); H01L 21/0209 (2013.01); H01L 21/02087 (2013.01); G03F 7/2022 (2013.01); G03F 7/70425 (2013.01); G03F 7/70733 (2013.01)

(58) Field of Classification Search
CPC .......... H01L 21/02087; H01L 21/0209; H01L 21/02096; H01L 21/02098; G03F 7/2022; G03F 7/70733; G03F 7/70425; B08B 1/00; B08B 1/04

USPC ............................................ 134/6, 18, 26, 42
See application file for complete search history.

(56) References Cited

U.S. PATENT DOCUMENTS

| 5,518,542 A * | 5/1996 | Matsukawa ............. B08B 1/007 |
| | | 118/232 |
| 8,127,395 B2* | 3/2012 | Yoon ................. H01L 21/67046 |
| | | 134/6 |
| 8,821,644 B2* | 9/2014 | Sakuragi ............... B24B 37/345 |
| | | 134/1.3 |
| 2002/0092964 A1* | 7/2002 | Kim ...................... G03F 7/2028 |
| | | 250/201.2 |
| 2013/0074872 A1* | 3/2013 | Yeh ................... H01L 21/67051 |
| | | 134/6 |
| 2013/0258300 A1* | 10/2013 | Nishiyama ................ B08B 3/04 |
| | | 355/30 |

* cited by examiner

Primary Examiner — Saeed T Chaudhry
(74) Attorney, Agent, or Firm — Slater Matsil, LLP

(57) ABSTRACT

A method for cleaning an edge of a semiconductor wafer in a wafer edge exposure (WEE) apparatus includes positioning the semiconductor wafer having a resist thereon in a wafer positioning device. A brush bar is positioned adjacent a backside of the semiconductor wafer in the wafer positioning device. The brush bar engages and cleans a backside of the semiconductor wafer while the semiconductor wafer is disposed in the wafer positioning device. A height of an edge of the semiconductor wafer is detected. The focusing position of exposure light radiated toward the edge is controlled on the basis of a height of the edge. Exposure light is radiated towards an edge after the cleaning step.

20 Claims, 4 Drawing Sheets

METHOD AND APPARATUS FOR WAFER EDGE EXPOSURE AND BACKSIDE CLEANING

BACKGROUND

In wafer edge exposure apparatuses in which an edge of a resist coated wafer is exposed, various photolithography steps are used. FIG. 1 shows a flowchart representing a photolithography processing flow 100 to be effected for a certain layer (called here an "ith layer") in connection with a related art semiconductor device manufacturing method. During the processing shown in FIG. 1, a resist is applied over or coated onto a semiconductor wafer by a spin coating method (step 102).

After the resist has been applied to the wafer surface, it undergoes a soft bake or pre-exposure bake to drive off most of the solvent in the resist to improve adhesion, promote resist uniformity on the wafer, and achieve better linewidth control during etching (step 104). Step 106 is alignment and exposure. The mask is aligned to the correct location of the resist-coated wafer. Once aligned, the mask and wafer are exposed to controlled light (e.g., UV light) to transfer the mask image to the resist-coated wafer.

The semiconductor wafer is further subjected to wafer edge exposure (WEE) processing performed by an edge exposure apparatus (step 108) and followed by a post exposure bake (step 110). In step 108, the edge exposure apparatus is used for exposing an edge of the wafer over a desired width (e.g., 1 mm or 2 mm).

When having finished undergoing the pattern exposure processing and edge exposure processing, the semiconductor wafer is subjected to a process of developing a resist (step 112). As a result of the processing being performed, the resist located along the edge of the wafer is removed over a desired width (e.g., 1 mm or 2 mm), and the resist on the semiconductor wafer is patterned into a desired pattern.

There is then performed processing for etching the semiconductor wafer while the thus patterned resist is taken as a mask or implanting impurities into the semiconductor wafer (step 114).

In wafer edge exposure, foreign substances or contaminants such as resist residues, for example can sometimes form on the backside of the wafer. These contaminants can cause exposure problems. FIG. 2a depicts a situation in which an in-focused image is transferred to resist coated wafer 200. An exposure light 204a transfers a mask pattern 202 to a lens 206 which then produces a focused light 204b onto the resist coated wafer 200. In FIG. 2b, however due to a contaminant 240 on the backside of the resist coated wafer 200, the light 204b becomes out of focus and therefore mask pattern 202 cannot faithfully be transferred to the resist coated wafer 200. Contaminants on the backside of wafers can lead to yield and reliability problems.

BRIEF DESCRIPTION OF DRAWINGS

Embodiments of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

In the following description, specific details are set forth to provide a thorough understanding of embodiments of the present disclosure. However, one having ordinary skill in the art will recognize that embodiments of the disclosure can be practiced without these specific details. In some instances, well-known structures and processes are not described in detail to avoid unnecessarily obscuring embodiments of the present disclosure.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are intended for illustration.

Figure 1:
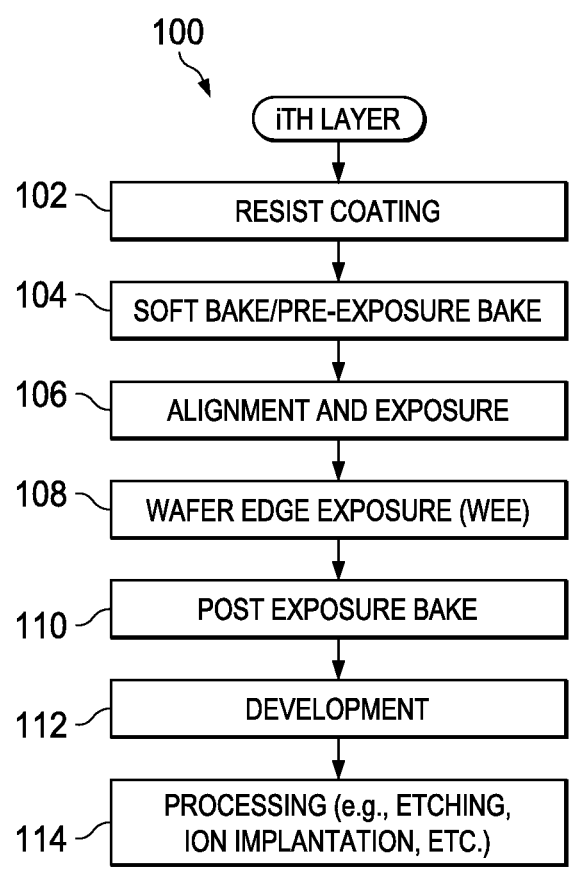
FIG. 1 is a flowchart of a processing flow to be effected for a certain layer in connection with a related art semiconductor device manufacturing method.
Figure 2A:
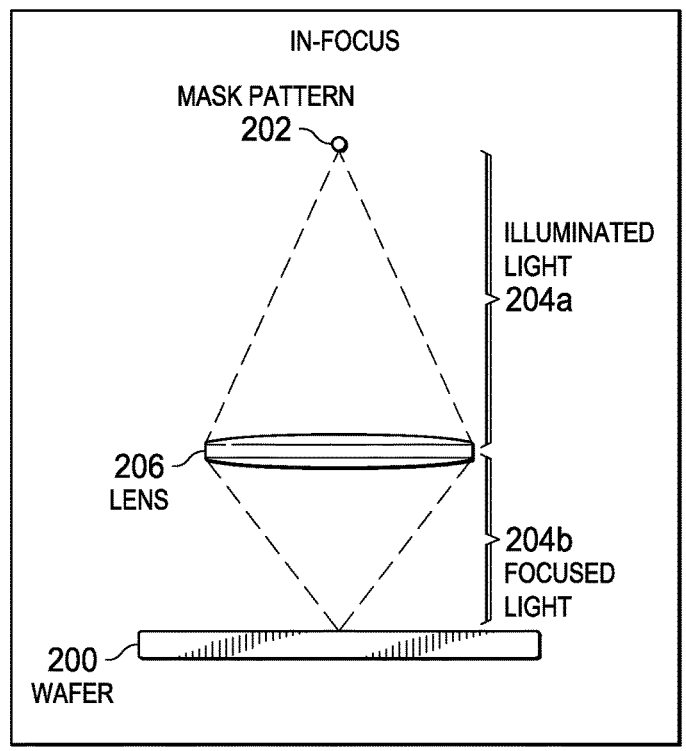
FIG. 2a is a diagram of an edge exposure process in which an in-focus image is transferred to a resist coated wafer.
Figure 2B:
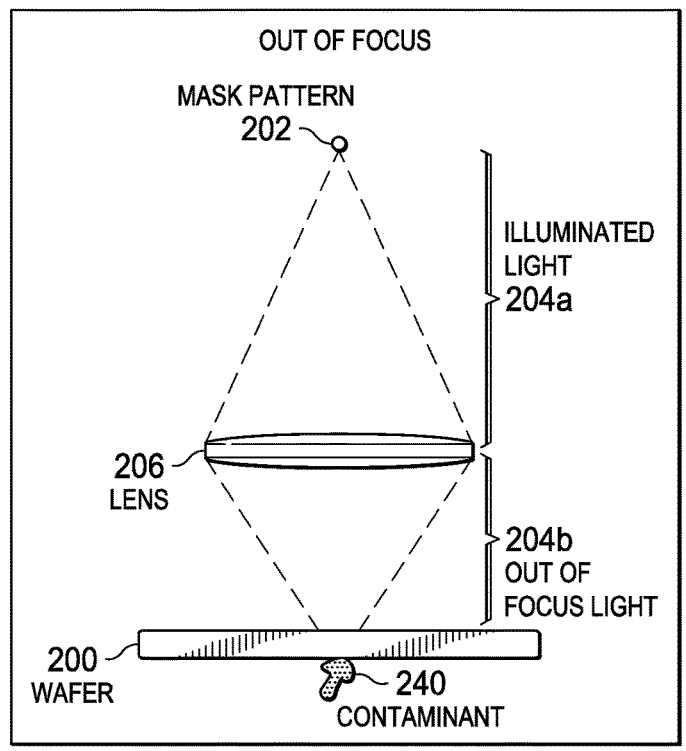
FIG. 2b is a diagram of an edge exposure process in which an out of focused image is transferred to a resist coated wafer due to contaminants.
Figure 3:
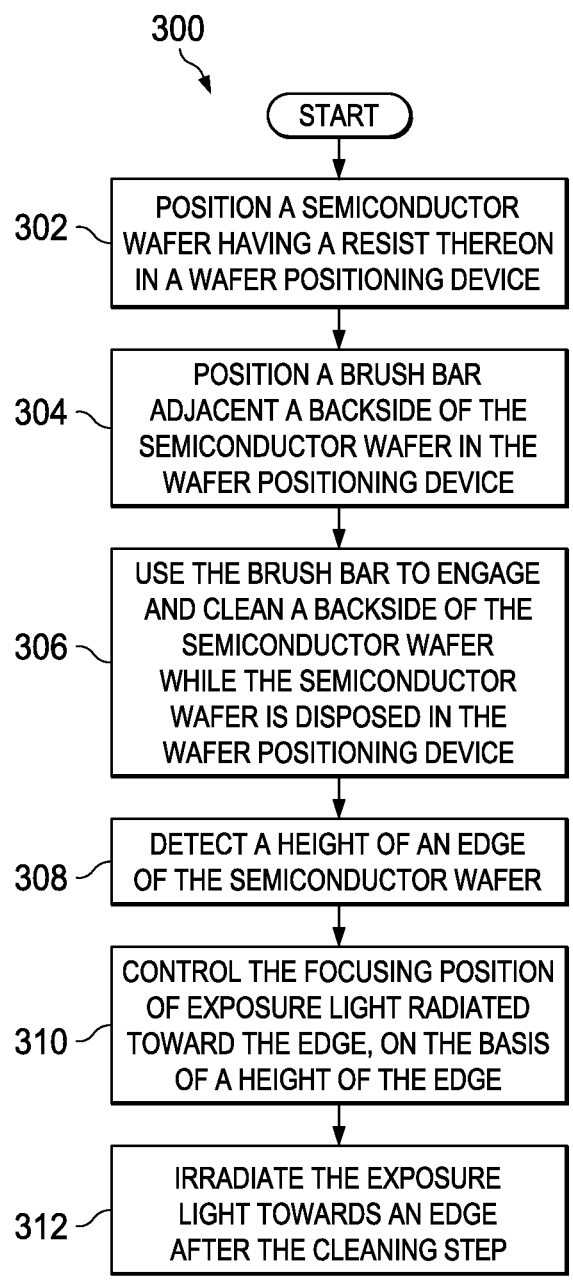
FIG. 3 is a flow chart of a method of cleaning the backside of a wafer during a wafer edge exposure process, according to an embodiment of the present disclosure.

FIG. 3 is a flowchart of a method 300 for cleaning a backside of a wafer during a wafer edge exposure process according to various aspects of the present disclosure. Referring to FIG. 3, the method 300 includes block 302, in which a semiconductor wafer having a resist thereon is positioned on a wafer positioning device. The method 300 includes block 304, in which a brush bar is positioned adjacent a backside of the semiconductor wafer. The method 300 includes block 306, in which the brush bar is used to engage and clean a backside of the semiconductor wafer while the semiconductor wafer is disposed in the wafer positioning device. Cleaning a backside of the wafer includes removing contaminants formed on the backside of the wafer. The method 300 includes block 308, in which a height of an edge of the semiconductor wafer is detected. The method 300 includes block 310, in which the focusing position of the exposure light radiated toward the edge is controlled, on the basis of a height of the edge. The method 300 includes block 312, in which the exposure light is irradiated towards an edge after the step of cleaning the backside of the semiconductor wafer.

It is understood that additional processes may be performed before, during, and/or after the blocks 302-312 shown in FIG. 3 to clean a backside of the wafer and expose a wafer edge, but these additional processes are not discussed herein in detail for the sake of brevity.

Figure 4:
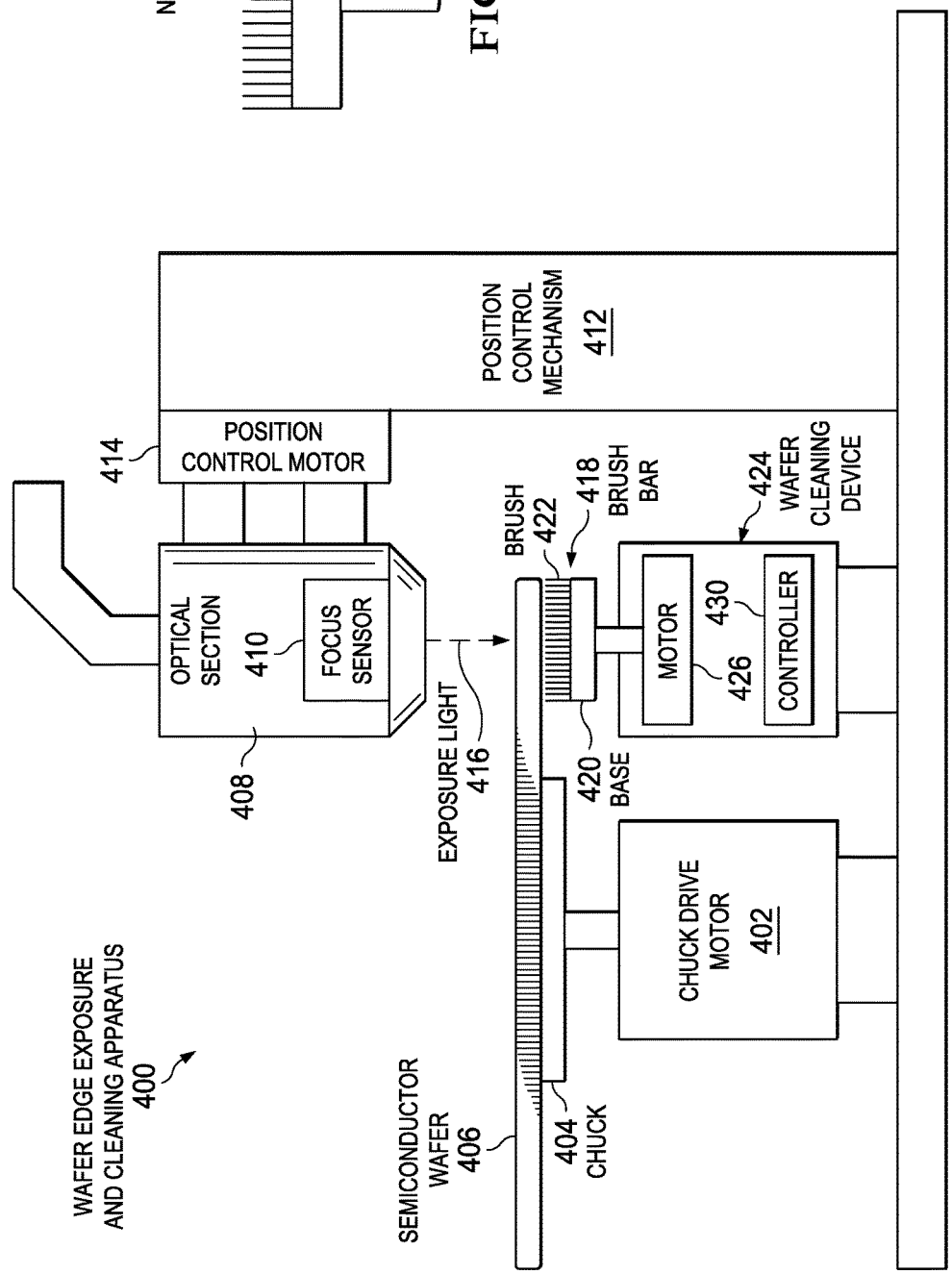
FIG. 4 is an illustration of an apparatus for cleaning the backside of a wafer during a wafer edge exposure process, according to an embodiment of the present disclosure.

FIG. 4 is an illustration showing the principal section of a wafer edge exposure and wafer backside cleaning apparatus 400, according to an embodiment of the present disclosure. As the name suggests, the wafer edge exposure and wafer backside cleaning apparatus 400 cleans and removes contaminants from a backside of a semiconductor wafer having a resist thereon before exposing an edge thereof and then patterning the resist on the wafer. If contaminants were not removed prior to the wafer edge exposure process, exposure problems may result. The mask pattern exposed on the resist may be out of focus leading to yield and reliability issues.

As shown in FIG. 4, the wafer edge exposure and cleaning apparatus 400 has a chuck drive motor 402. A chuck 404 is provided on top of the chuck drive motor 402. The chuck 404 is an element for retaining a semiconductor wafer 406 to be placed thereon. The chuck drive motor 402 can rotate the semiconductor wafer 406 held on the chuck 404 about a central axis.

An optical section 408 is provided in an elevated position relative to the chuck 404. An exposure light radiation section (not shown) for radiating exposure light of predetermined width to the edge of the semiconductor wafer 406 is provided at a lower end of the optical section 408. In the wafer edge and backside cleaning apparatus 400 according to the present embodiment, exposure light 416 can be radiated onto the edge of the semiconductor wafer 406; more specifically, an annular portion of predetermined width located at the outermost edge of the semiconductor wafer 406, by means of rotating the chuck drive motor 402 under circumstances where the optical section 408 produces exposure light 416.

A focus sensor 410 is provided at the lower end of the optical section 408. The focus sensor 410 can detect a distance from the lower end of the optical section 408 to the surface of the semiconductor wafer 406; namely, a surface to be exposed. For instance, in a case where resist is applied over the surface of the semiconductor wafer 406, the focus sensor 410 can detect a distance from the lower end of the optical section 408 to the surface of the resist. The distance detected by the focus sensor 410 is supplied to an unillustrated control unit.

The optical section 408 is retained by a position control mechanism 412. The position control mechanism 412 is provided with a position control motor 414 for changing the vertical position of the optical section 408. The position control motor 414 is controlled by the control unit (not shown).

In some embodiments, the optical section 408 may be made stationary, and optimum focusing conditions may be realized by vertical movement of the semiconductor wafer 406. A zooming mechanism may be provided to the optical section 408, whereby optimum focusing conditions are realized by changing the focal distance of the optical section 408 through use of the zooming mechanism.

Still referring to FIG. 4, the wafer edge exposure and wafer backside cleaning apparatus 400 includes a wafer cleaning device 424, according to an embodiment of the present disclosure. The wafer cleaning device 424 includes a brush bar 418 that is positioned below the semiconductor wafer 406 for cleaning an edge thereof. The brush bar 418 includes a portion that is operable to contact the backside of the semiconductor wafer 406. The brush bar 418 includes a base 420 and brush 422 (e.g., bristles). However, other configurations of the brush bar 418 are possible and the scope of the present disclosure is not limited to the particular brush bar structure employed. The brush bar 418 may contact the backside of the semiconductor wafer 406. For example, the brush 422 may contact the backside of the wafer 406 for sweeping away particulate matter from the backside of the wafer through a brushing motion.

In an embodiment, the brush 422 includes a flexible, comb-like configuration of material. Other embodiments are possible, including, for example, pads. Exemplary materials include polyvinyl acetate (PVA), mohair, sponge, fibers, cloth, nylon, rayon, polyester, polymer, or the like.

In some embodiments, brush 422 is stationary, whereas in other embodiments, brush 422 is movable being driven by a motor 426. In one embodiment, the brush 422 moves from a central position on the underside of the wafer 406 to an edge position of the wafer during the cleaning step. In another embodiment, brush 422 rotates at a rotational speed of less than 500 rpm, and preferably at less than 300 rpm. The wafer 406 may be stationary or may also rotate. For example, the wafer 406 that is held on the chuck 404 can rotate in a direction opposing to or consistent with a direction of rotation of the brush 422. In other embodiments, the brush 422 may be impregnated with a solvent such that a separate solvent dispenser is not necessary.

Figure 5:
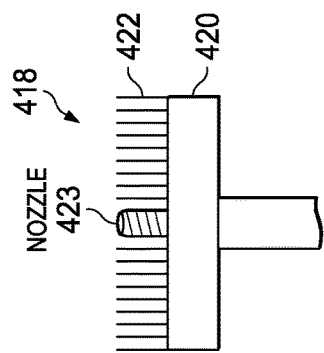
FIG. 5 is a cross-sectional view of a brush cleaning apparatus for cleaning a backside of a wafer, according to an embodiment of the present disclosure.

In some embodiments, the brush bar provides both physical and chemical cleaning to the backside of the wafer 406 by including a nozzle 423 for spraying cleaning fluid onto a backside of the wafer 406, as shown in FIG. 5. The nozzle 423 may be a single outlet and/or any plurality of outlets and may be positioned about an inside portion of the wafer edge, for example about 1.5 millimeters from the outermost edge of the wafer 406. It is understood that various angles for nozzle 423 can be used in different embodiments. The nozzle 423 may be connected to a fluid supply for ejecting a fluid. The fluid can be one of many different fluids, including cleaning fluids, de-ionized water, O3, SC1, surfactant, and/or air. Example cleaning fluids supplied to and by the nozzle 423 include, for example, APM (Ammonia hydroxide-hydrogen peroxide-wafer mixture), de-ionized water (DIW) (including hot DIW), SC1 (de-ionized water (DI), NH4OH, H2O2), diluted NH4OH, SC2 (DI, HCl, H2O2), ozonated de-ionized water (DIWO3), SPM (H2SO4, H2O2), SOM (H2SO4, O3), SPOM, H3PO4, dilute hydrofluoric acid (DHF), HF, HF/EG, HF/HNO3, NH4OH, HF, and/or other suitable chemicals. The chemicals (or cleaning fluids) delivered via nozzle 423 may be between approximately 0 degrees Celsius and approximately 250 degrees Celsius. In a further embodiment, the chemicals delivered by nozzle 423 are between approximately 23 degrees Celsius and approximately 80 degrees Celsius. The chemicals (e.g., spray) from nozzle 423 are incident the backside of the semiconductor wafer 406.

In one embodiment, cleaning the backside of the wafer 406 with the brush bar 418 and cleaning the backside of the wafer 406 with a chemical spray are performed separately.

In another embodiment, cleaning the backside of the wafer 406 with the brush bar 418 and cleaning the backside of the wafer 406 with a chemical spray are performed concurrently.

In some embodiments, the wafer cleaning device 424 includes megasonic capabilities in applying the spray and/or the brush bar 418 to the backside of the semiconductor wafer 406.

A controller 430 in wafer cleaning device 424 controls and adjusts via a motor (not shown) a distance between the brush bar 418 and a back surface of the wafer 406. One skilled in the art understands that various mechanisms can be employed to ensure that brush bar 418 maintains close contact to the underside of semiconductor wafer 406 and with sufficient upward pressure to ensure good scrubbing and/or cleaning action, without such pressure as to damage the surface of the wafer. In some embodiments, the upward pressure applied is between about 10 and 200 Pa.

After contaminants are brushed off or removed by a fluid, the contaminants can then be carried away to a holding tank (not shown) by way of an exhaust or vacuum action, for example.

The present disclosure has described various exemplary embodiments. According to one embodiment, a method for cleaning an edge of a semiconductor wafer in a wafer edge exposure (WEE) apparatus includes positioning the semiconductor wafer having a resist thereon in a wafer positioning device. A brush bar is positioned adjacent a backside of the semiconductor wafer in the wafer positioning device. The brush bar engages and cleans a backside of the semiconductor wafer while the semiconductor wafer is disposed in the wafer positioning device. A height of an edge of the semiconductor wafer is detected. The focusing position of exposure light radiated toward the edge is controlled on the basis of a height of the edge. Exposure light is radiated towards an edge after the cleaning step.

According to another embodiment, a wafer edge exposure (WEE) apparatus includes a chuck for retaining a semiconductor wafer thereon. The semiconductor wafer has a resist thereon, and the chuck rotates about a central axis. A wafer cleaning device is positioned at an edge of an underside of the semiconductor wafer and slidably engages the wafer underside during a cleaning event. An optical section radiates exposure light toward an edge of the semiconductor wafer. A focus sensor for detecting a height of the edge. A focus position control mechanism for controlling the focal position of the exposure light originating from the optical section, on the basis of the value detected by the focus sensor.

According to yet another embodiment, a method for cleaning a semiconductor wafer in a wafer edge exposure (WEE) apparatus includes a cleaning step for cleaning a back surface of an edge of the semiconductor wafer with a cleaning apparatus. A detection step for detecting a height of an edge of the semiconductor wafer, the semiconductor wafer having a resist thereon. A control step for controlling the focusing position of exposure light radiated toward the edge, on the basis of a height of the edge. An exposure step of radiating exposure light towards an edge after the cleaning step.

In the preceding detailed description, specific exemplary embodiments have been described. It will, however, be apparent to a person of ordinary skill in the art that various modifications, structures, processes, and changes may be made thereto without departing from the broader spirit and scope of the present disclosure. The specification and drawings are, accordingly, to be regarded as illustrative and not restrictive. It is understood that embodiments of the present disclosure are capable of using various other combinations and environments and are capable of changes or modifications within the scope of the claims and their range of equivalents.

What is claimed is:

1. A method for cleaning a semiconductor wafer in a wafer edge exposure (WEE) apparatus, the method comprising:
   cleaning a back surface of a semiconductor wafer with a cleaning apparatus by contacting a centrally disposed back surface portion of the semiconductor wafer with a brush, and after contacting the centrally disposed back surface portion, laterally moving the brush on the semiconductor wafer toward an edge of the semiconductor wafer, wherein the brush is moved with a motor, and the brush is interposed between the motor and the semiconductor wafer;
   detecting a height of the edge of the semiconductor wafer with a focus sensor located on an opposite side of the semiconductor wafer from the cleaning apparatus, the semiconductor wafer having a resist thereon;
   controlling a focusing position of exposure light radiated toward the edge, based on the height of the edge; and
   radiating exposure light towards the edge after cleaning.

2. The method of claim 1, wherein cleaning the back surface of the semiconductor wafer includes contacting the back surface of the semiconductor wafer with a cleaning fluid.

3. The method of claim 1, wherein contacting the back surface of the semiconductor wafer with a cleaning fluid comprises dispensing a chemical spray on the back surface of the semiconductor wafer.

4. The method of claim 1, wherein cleaning the back surface of the semiconductor wafer includes controlling and adjusting a distance between the cleaning apparatus and the back surface of the semiconductor wafer.

5. The method of claim 1, wherein:
   detecting includes sensing a distance between an optical section for outputting exposure light and the edge; and
   controlling includes controlling a focusing position of the exposure light originating from the optical section such that a focus of the exposure light matches the height of an edge surface.

6. The method of claim 1, wherein only an annular portion of the edge is irradiated during radiating exposure.

7. The method of claim 1, wherein contacting the centrally disposed back surface portion of the semiconductor wafer with the brush occurs before contacting the edge of the semiconductor wafer with the brush.

8. The method of claim 1, wherein contacting the centrally disposed back surface portion of the semiconductor wafer with the brush occurs without contacting the edge of the semiconductor wafer with the brush.

9. A method for cleaning an edge of a semiconductor wafer in a wafer edge exposure (WEE) apparatus, the method comprising:
   positioning the semiconductor wafer having a resist thereon in a wafer positioning device;
   positioning a brush bar adjacent a backside of the semiconductor wafer in the wafer positioning device, wherein the brush bar is positioned with a motor, and the brush bar interposes the motor and a portion of the semiconductor wafer;
   using the brush bar to clean the backside of the semiconductor wafer while the semiconductor wafer is disposed in the wafer positioning device, wherein the brush bar is moved from a central portion of the semiconductor wafer to an edge of the semiconductor wafer;
   detecting a height of the edge of the semiconductor wafer;
   controlling a focusing position of exposure light radiated toward the edge of the semiconductor wafer based on the height of the edge; and
   irradiating exposure light towards the edge of the semiconductor wafer after cleaning and while the semiconductor wafer is positioned within the wafer positioning device.

10. The method of claim 9, wherein cleaning the backside using the brush bar includes contacting the backside of the semiconductor wafer with a brush disposed on the brush bar.

11. The method of claim 9, wherein positioning the semiconductor wafer in the wafer positioning device includes rotating the semiconductor wafer using the wafer holding device during the cleaning of the backside of the semiconductor wafer.

12. The method of claim 11, wherein cleaning the backside of the semiconductor wafer with the brush bar includes moving the brush bar from the central portion of the semiconductor wafer to the edge of the semiconductor wafer while the semiconductor wafer is rotating.

13. The method of claim 11, further comprising dispensing a chemical spray on the backside of the semiconductor wafer.

14. The method of claim 13, wherein dispensing a chemical spray on the backside of the semiconductor wafer and cleaning the backside of the semiconductor wafer are performed substantially concurrently.

15. A method for cleaning a semiconductor wafer, the method comprising:
cleaning a surface of an edge portion of a semiconductor wafer with a cleaning apparatus, the semiconductor wafer comprising a major surface, the major surface comprising the surface of the edge portion of the semiconductor wafer, wherein cleaning the surface of the edge portion of the semiconductor wafer comprises engaging a brush bar with a central portion of the semiconductor wafer, and moving the brush bar from the central portion of the semiconductor wafer to the edge portion of the semiconductor wafer, wherein movement of the brush bar is driven with a motor, and the brush bar, the motor, and a portion of the semiconductor wafer are substantially aligned along a common axis;
detecting a height of the edge portion of the semiconductor wafer, the semiconductor wafer having a resist thereon;
controlling a focusing position of exposure light radiated toward the edge portion; and
radiating exposure light towards the edge portion after cleaning, wherein the semiconductor wafer is interposed between the cleaning apparatus and exposure light, wherein the semiconductor wafer is located on a first chuck during both the cleaning the surface and the radiating the exposure light.

16. The method of claim 15, wherein controlling the focusing position of exposure light radiated toward the edge portion is based on the height of the edge portion.

17. The method of claim 16, wherein cleaning the surface of the edge portion of the semiconductor wafer includes contacting the surface of the edge portion of the semiconductor wafer with a brush of the brush bar.

18. The method of claim 17, wherein the brush of the brush bar is moved from the central portion of the semiconductor wafer to the edge portion of the semiconductor wafer during cleaning.

19. The method of claim 17, wherein the brush of the brush bar is moved while the semiconductor wafer is rotated.

20. The method of claim 15, further comprising dispensing a chemical spray on the semiconductor wafer, and wherein dispensing the chemical spray on the semiconductor wafer and cleaning the surface of the edge portion of the semiconductor wafer are performed substantially simultaneously.

* * * * *